United States Patent [19]
Sankaran et al.

[11] Patent Number: 5,736,786
[45] Date of Patent: Apr. 7, 1998

[54] POWER MODULE WITH SILICON DICE ORIENTED FOR IMPROVED RELIABILITY

[75] Inventors: Venkateswara A. Sankaran, Farmington Hills; Xingyi Xu, Canton; Yi-Hsin Pao, Livonia; Wen-Je Jung, Ann Arbor, all of Mich.

[73] Assignee: Ford Global Technologies, Inc., Dearborn, Mich.

[21] Appl. No.: 625,826

[22] Filed: Apr. 1, 1996

[51] Int. Cl.$^6$ .......................... H01L 23/34; H01L 23/48
[52] U.S. Cl. .......................... 257/717; 257/724; 257/747; 257/779
[58] Field of Search .......................... 257/717, 724, 257/747, 779

[56] References Cited

U.S. PATENT DOCUMENTS

| | | | |
|---|---|---|---|
| 3,619,734 | 11/1971 | Assour et al. | 257/724 |
| 3,982,271 | 9/1976 | Olivieri et al. | 257/719 |
| 5,134,463 | 7/1992 | Yamaguchi | 361/707 |
| 5,182,628 | 1/1993 | Izawa et al. | 257/779 |

FOREIGN PATENT DOCUMENTS

| | | | |
|---|---|---|---|
| 1-19430(A) | 8/1989 | Japan | 257/724 |
| 1-194339 | 8/1989 | Japan | 257/724 |

*Primary Examiner*—Tom Thomas
*Assistant Examiner*—David Ostrowski
*Attorney, Agent, or Firm*—Mark S. Sparschu

[57] ABSTRACT

A power module has a metallic base plate layer and a substrate layer that has a first metallic layer, a dielectric layer, and a second metallic layer. A solder layer thermally and electrically connects the second metallic layer to the base plate. A plurality of silicon dice are mounted to the first metallic layer of the substrate. The solder layer has a void development region which after a predetermined number of thermal cycles does not significantly increase. The silicon dice are oriented on the substrate layer so that the silicon dice are not aligned over the void development region corresponding to the useful life of the module. The metallic base plate may also be mounted to a heatsink through a thermal grease layer. The heatsink may comprise the outer covering of the power module.

18 Claims, 3 Drawing Sheets

POWER MODULE WITH SILICON DICE ORIENTED FOR IMPROVED RELIABILITY

FIELD OF THE INVENTION

The present invention relates generally to a power module, and more specifically to a power module having silicon dice oriented to increase the life of the module.

BACKGROUND OF THE INVENTION

Electronic content in automobiles is increasing each year to meet increased customer demands and customer demands. Power modules must improve to meet the requirements of the increased electronic content. The present automotive power switching is done using a 12 volt system. Future applications, however, may require higher voltages. Higher system voltages are needed as automotive loads continue to escalate in order to achieve a cost-effective and efficient system.

The temperature extremes that electronic modules are subject to in automotive application range between −40° C. to 120° C. The harsh automotive environment presents a major challenge for power modules. Off-the-shelf power modules currently available in the market today are primarily designed for commercial and industrial drive applications. Modules in automotive applications experience significant thermal cycling, power cycling, and humidity conditions that are not presently designed into commercial and industrial drive applications. The stringent automotive conditions lead to poor reliability when applying presently available technology to automotive technology.

The main functions of a power module are to protect the electronics from harsh environments, to integrate multiple silicon devices for convenience of assembly and to provide an effective means for power dissipation. A power module package should have the following characteristics; (1) electrical isolation of the base plate from the semi-conductors, (2) good thermal performance, (3) good electrical performance, (4) long life and high reliability, (5) and low cost.

In most power electronic applications the case of the high power devices are electrically isolated from the power source. Commonly the silicon die is isolated from the case with an electrical insulator. Electrical isolation of the base plate from the semi-conductor is necessary in order to build a phase leg, a three phase inverter or other circuits which have components that need to be connected in a particular fashion into one package.

Thermal performance is measured by the maximum temperature rise in the die at given power dissipation level with a fixed heatsink temperature. The lower the die temperature the better the package. The heat generated in a device arises from a combination of switching losses, and conduction losses. The failure rate of the silicon device is a function of the device temperature. The thermal performance of the module dictates the silicon area used in the module and the heatsink design, both of which effect the cost, size and weight of the package.

Long life and high reliability are primarily attained through minimization of thermal cycling, minimization of ambient temperature and proper design of the transistor stack. Thermal cycling fatigues material interfaces because of the coefficient of thermal expansion (CTE) mismatch between the dissimilar materials. As the materials undergo temperature variation they expand and contract at different rates, which stresses the interface between the layers and can cause interface cracking or debonding. Wirebonds on the die are also prone to debonding or breakage because of the stresses they undergo. Chemical and material degradation processes in the silicon device are accelerated with increasing temperature, so keeping the absolute temperature of the device low as well as minimizing the temperature changes is important.

Another consideration, especially in high volume automotive applications, is cost. Low cost may be achieved in a variety of ways. Both manufacturing and material cost must be taken into account when designing a power module. Materials that are easy to form must be implemented whenever possible. Also, manufacturing processes which have a high yield, must also be implemented wherever possible. Further, reliability must be designed into the module to prevent the need for future replacement and repair.

It is therefore necessary to reduce the thermal resistance and to keep the temperature rise to a minimum in a power module without the use of special materials while providing high reliability.

SUMMARY OF THE INVENTION

The present invention overcomes the disadvantages of the related art by providing a metallic base plate, a substrate comprising an dielectric layer sandwiched between a first metallic layer and a second metallic layer, a solder layer electrically and thermally connecting the second metallic layer to the base plate; and a plurality of silicon dice connected to the first metallic layer. The solder layer has a solder void development region formed during thermal cycling of the power module. The silicon dice are oriented on the substrate so that the void development region does not extend beneath the dice.

An advantage of the present invention is that mature copper base plate transistor stack technology may be used for ease of manufacturing and lower cost without using special materials for the base plate and substrate.

BRIEF DESCRIPTION OF THE DRAWINGS

These and other objects, advantages, and features of the present invention will be apparent to those skilled in the art upon reading the following description with reference to the accompanying drawings, in which.

DETAILED DESCRIPTION OF THE PREFERRED EMBODIMENT

Figure 1:
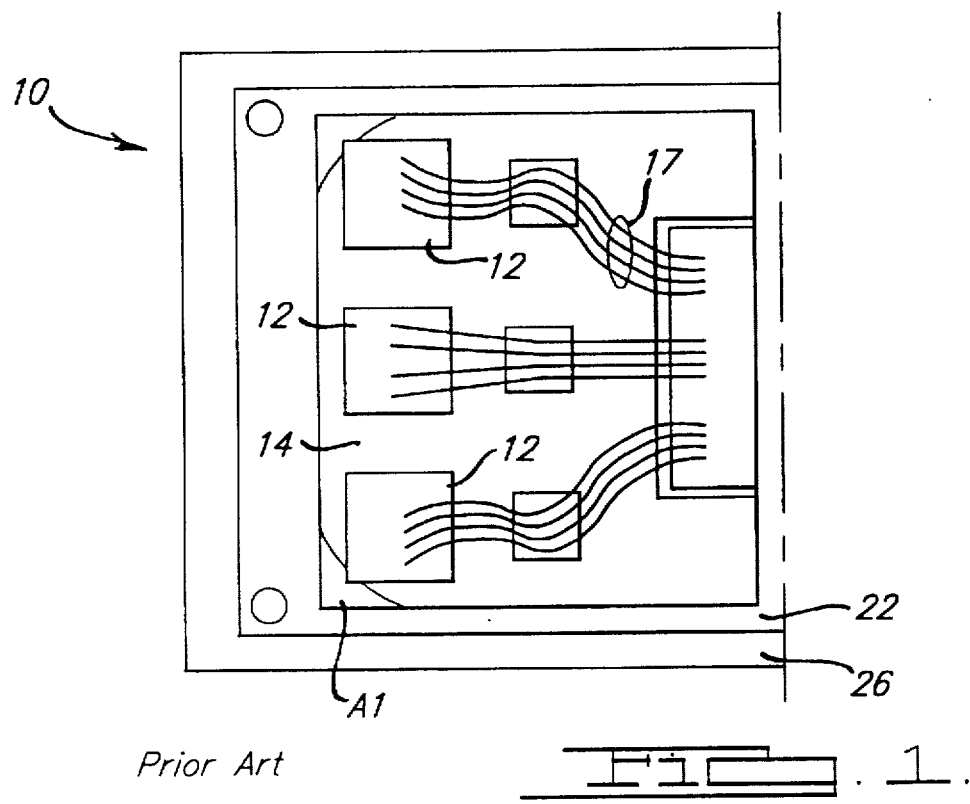
FIG. 1 is a top view of a prior art power module.
Figure 2:
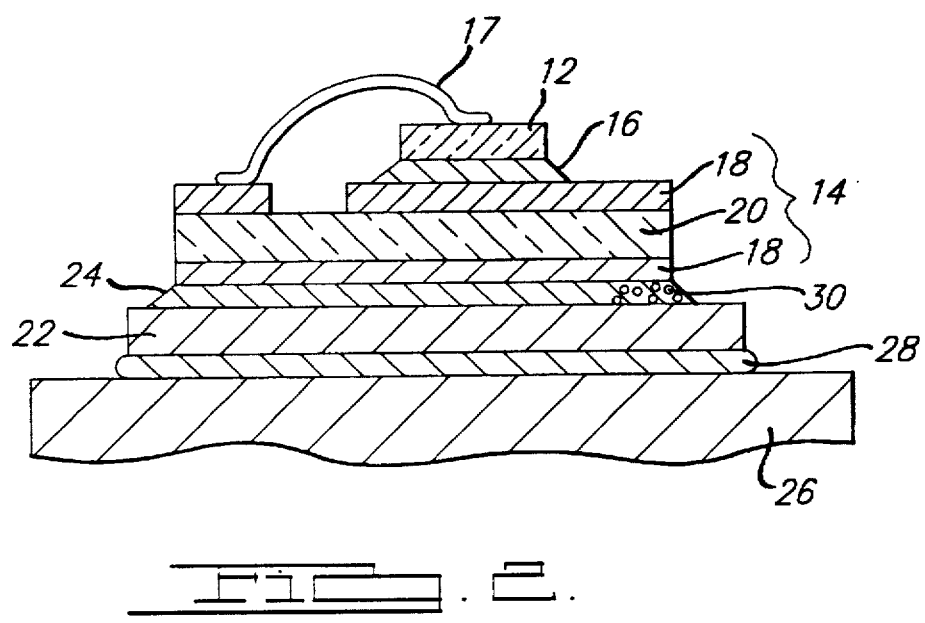
FIG. 2 is a cross-sectional view of a transistor stack.
Figure 3:
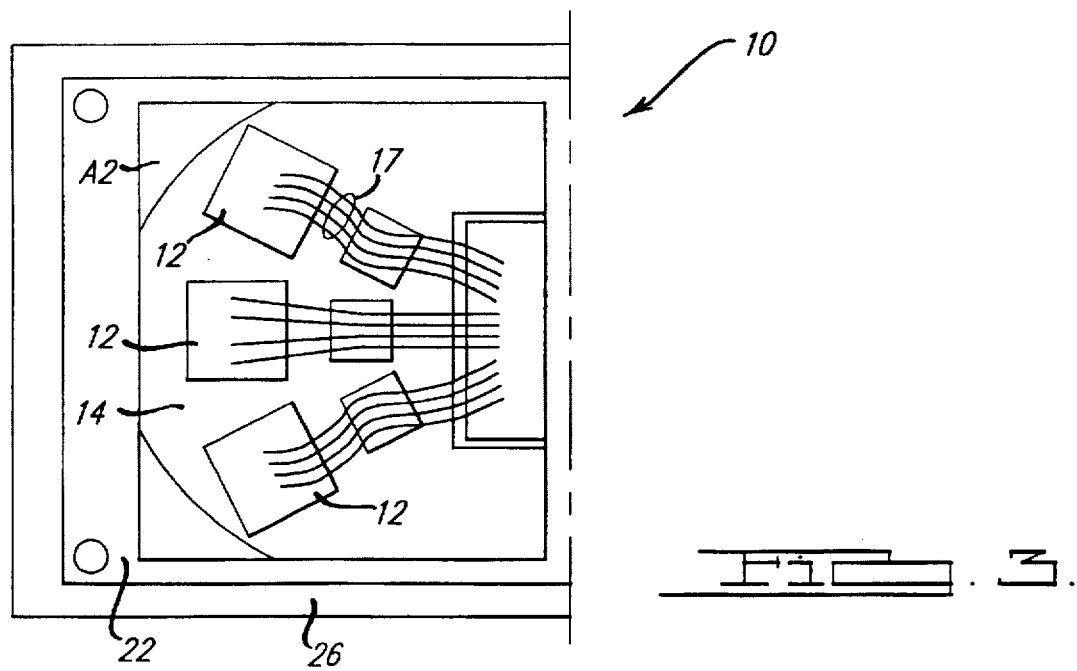
FIG. 3 is a top view of a power module according to the present invention.

Referring to FIGS. 1, 2, and 3 components 12 are shown mounted to a substrate layer 14 through a solder layer 16. A wirebond 17 connects components 12 to traces formed on substrate layer 14. A base plate 22 is bonded to layer 14 through solder layer 24. A heatsink 26 is bonded to base plate 22 through a layer of thermal conductor such as a thermal grease 28, an epoxy or a thermal pad. Heatsink 26 is preferably the outer covering or housing of power module 10.

Components 12 are preferably silicon dice. Silicon has a coefficient of thermal expansion of 4.1 ppm/K. In a power module components 12 are typically power transistors.

Substrate layer is preferably a direct bond copper substrate (DBC) having a dielectric layer that is preferably a ceramic layer 20 sandwiched between adjacent metallic layer 14 that are preferably copper layers 18. DBC substrate layer 14 is formed by forming a thin oxide on the copper layer 18, then bringing the copper layer 18 into intimate contact with a ceramic at elevated temperatures. The thin oxide layer on the copper layer 18 chemically bonds with ceramic 20. The assembly is cooled back to room temperature which imparts additional strength to the sandwich because the ceramic is under compression due to the higher coefficient of thermal expansion of copper layers 18. As shown, ceramic layer 20 is 25 mils thick and copper layers 18 are each 12 mils thick. Ceramic layer 20 may be many different ceramics such as $Al_2O_3$, AlN, or BeO. The CTE of copper is 17 ppm/K. The preferred embodiment preferably uses AlN as the ceramic. The CTE of AlN is 4.5 ppm/K. The bulk CTE of the direct bond copper substrate 14 is much closer to the CTE of ceramic than to the CTE of copper if the relative thickness of the ceramic and copper are in proper proportion.

DBC substrate technology has the advantages that the outer copper layer 18 can be etched to form circuit traces. Also, the electrical isolation and high thermal conductivity of the ceramic make DBC technology good for high power applications.

Base plate 22 is made of copper to promote good thermal conductivity. Base plate 22 is preferably about 3 millimeters thick.

Because of the CTE mismatch between base plate 22 and DBC substrate layer 14, solder layer 24 develops voids 30. Referring back to FIG. 1, area A1 was found to be the region where voids occur. Voids start in the corners of the DBC substrate layer 14 in the solder layer 24. As voids move from the corner, they grow under the components 12 in prior designs. As voids move under component 12 a self destructive process begins. The thermal resistance of solder layer 24 increases as the voids increase under the components 12. Thermal cycling increases the voids at a higher rate. As the thermal resistance increases the temperature of the die increases. The elevated temperature may lead to a breakdown of a component 12. Typically in a power module, several components 12 are in parallel. If one component fails the rest to of the components must handle additional currents which increases the temperatures of the remaining components. This additional current and temperature may also cause fatigue of wirebonds 17 and chemical degradation.

Referring now to FIG. 3, components 12 are preferably arranged away from the area where solder voids develop during the normal life of the power module. The void development region A2 was found after extensive thermal cycling. Void development region A2 stabilized when components were moved so that void development region A2 did not extend under components 12. The thermal resistance of the module without a crack was determined experimentally to be about 0.065° C. per/W. The increase in the junction temperature between the DBC substrate layer 14 and base plate 22 is relatively small if the crack does not extend beneath the component 12. For example, the thermal resistance only increases 0.004° C./W for a crack not extending under a component. For a crack extending under a component, however, the thermal resistance increases to 0.25° C./W. From these results, it shows cracks are negotiable as long as the crack does not extend beneath or near the component. It was also experimentally found that solder layer cracks tend to stabilize over a number of thermal cycles. Crack growth was measured in the solder inner layer by using a C-mode scanning acoustic microscope to determine the associated crack length. Once the void development region was found experimentally by cycling the power module through temperature gradients components are located outside the solder void development region A2 to form a highly reliable module.

Figure 4:
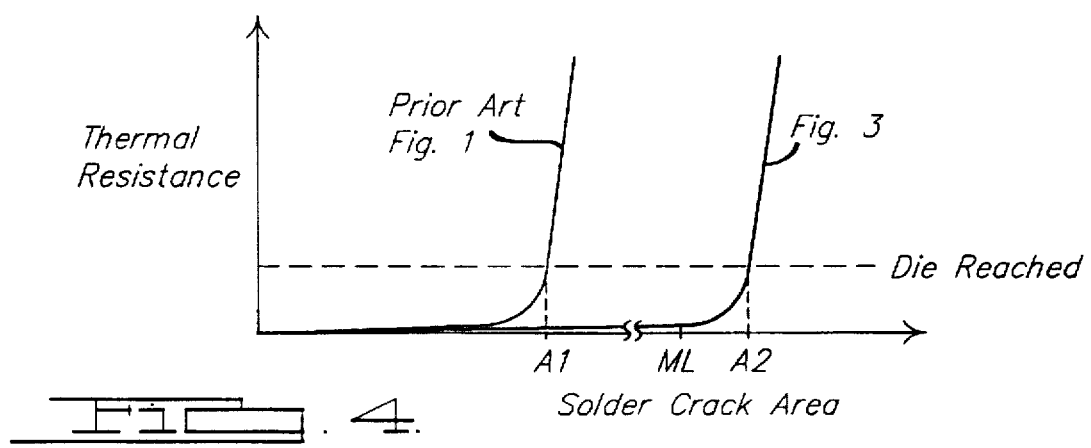
FIG. 4 is a graph of thermal resistance versus crack area of a conventional module and a module according to the present invention.

Referring now to FIG. 4, a graph of thermal resistance versus solder crack area is shown from FIG. 1 area A1 is where the solder void region begins to extend under component 12. Once that point is reached, the solder void development region extends under the die and the thermal resistance increases significantly as shown with respect to FIG. 3. In the module of the preferred embodiment, the area A2 must be reached before the solder layer will cause a failure under the component. When area A2 increases to extend under components, the module is preferably well beyond the useful life of the module.

Figure 5:
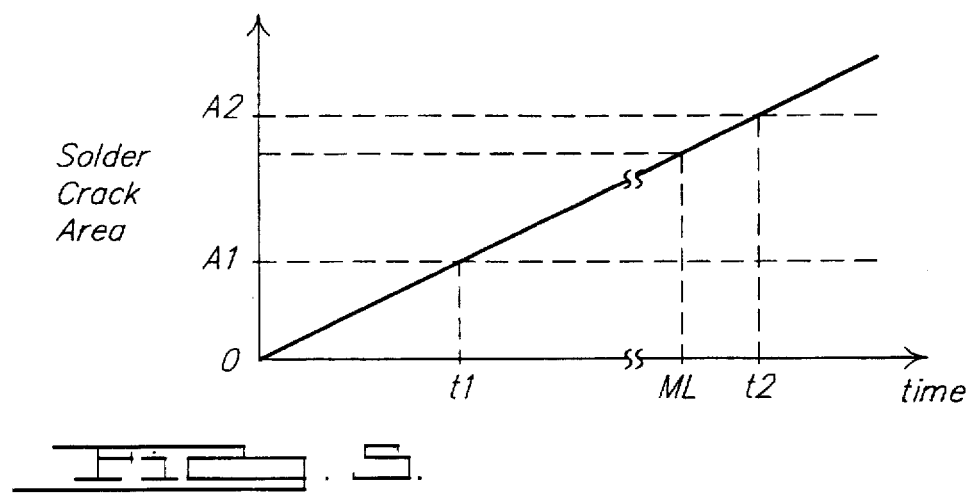
FIG. 5 is a graph of a solder crack area versus module life.

Referring to FIG. 5, solder crack area versus time is shown. As the time continues to t1 which corresponds to FIG. 1 when A1 is reached, time t1 is much shorter than the time t2 of the module of FIG. 3 which is represented by when the time reaches the intersection with the area A2. The module life ML is reached before A2. The module life can be adjusted so that the useful life of the component may be reached long before the module will fail due to development of solder voids.

Figure 6:
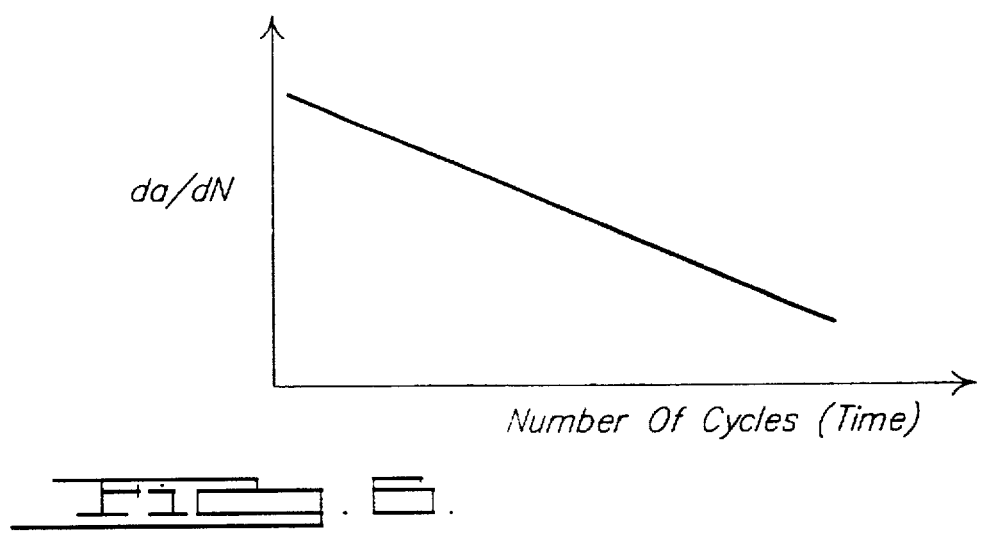
FIG. 6 is a graph of solder crack growth rate versus time.

Referring now to FIG. 6, the solder crack growth rate dA/dN versus time is shown. The slope of the line illustrates that the crack growth rate or void growth rate decreases steadily as the number of cycles increases. As the number of thermal cycles increases voids develop at a slower rate.

Figure 7:
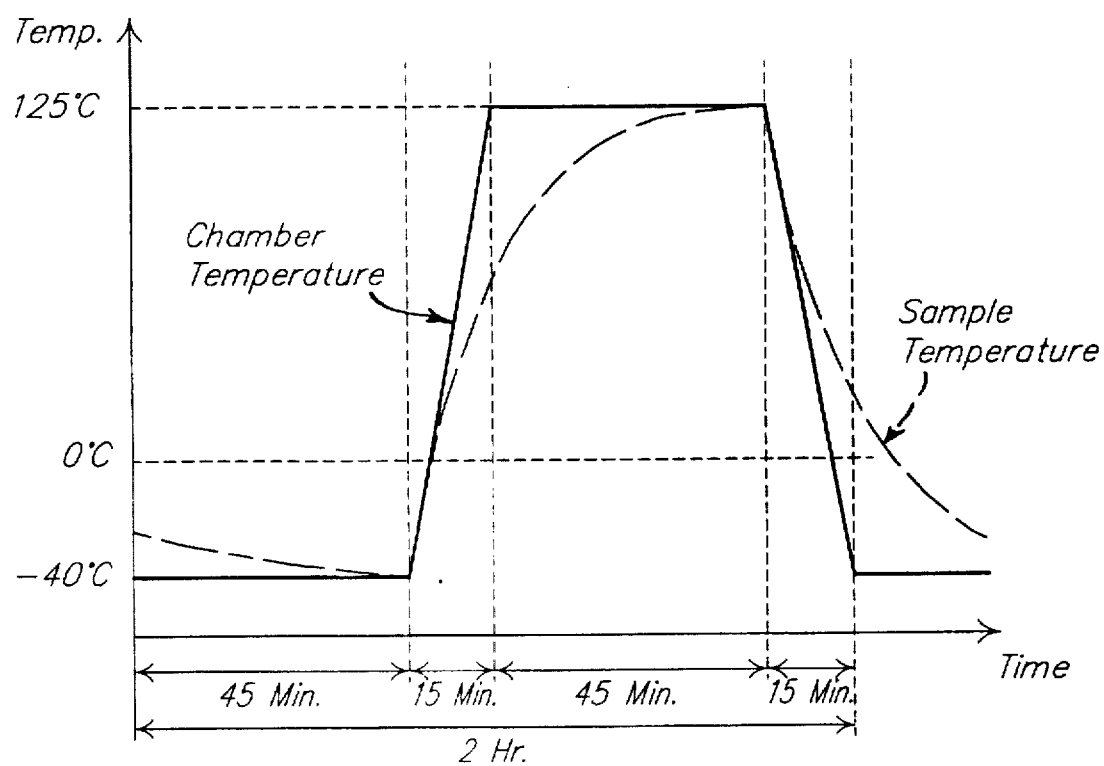
FIG. 7 is a time versus temperature plot of the test cycle for determining solder void development region A2.

The thermal cycle used to determine solder void area is shown in FIG. 7. The chamber temperature shown in the solid line. The temperature of the module is shown in a dotted line. The component was placed into a −40° chamber for 45 minutes. The temperature was then increased over 15 minutes to 125° C. which was maintained for 45 minutes. The chamber then was brought down to −40° C. over 15 minutes. Several cycles will run to determine the solder void development region of the useful life of the power module. As stated above the solder void region is analyzed using a scanning acoustic microscope. The components are then soldered to the substrate layers on new modules beyond the solder void development region. An extra margin between the solder void development region during the useful life of the module and placement of the components may be implemented to provide an extra factor of usefulness and to compensate for any manufacturing variation.

As would be evident to one skilled in the art, several modifications of the invention may be made while still being within the scope of the appended claims. For example, the above disclosure is described with respect to direct bond copper substrate technology, however, the FR4 technology, thick film printed technology and insulated metal substrate technology may also be used in place of direct bond copper technology. The thick film technology uses ceramic substrate for electrical isolation and insulated metal substrate technology uses a polymer dielectric for the same purpose. Thick film, use a conductive ink land patterns such as silver palladium rather than copper land patterns on the dielectric layer. Voiding may occur due to the mismatch of CTEs in thick film printed technology and insulated metal substrate technology.

We claim:

1. A power module comprising:

a metallic base plate;

a substrate comprising an dielectric layer sandwiched between a first metallic layer and a second metallic layer;

a solder layer electrically and thermally connecting said second metallic layer to said base plate; and a plurality of silicon dice connected to said first metallic layer; and said solder layer having a solder void development region, said silicon dice oriented on said substrate so that said void development region does not extend beneath said dice.

2. A power module as recited in claim 1 further comprising a heat sink, said heat sink thermally coupled to said base.

3. A power module as recited in claim 2 further comprising a thermal grease layer coupling said heat sink to said base plate.

4. A power module as recited in claim 1 wherein said metallic layer of said substrate comprises copper.

5. A power module as recited in claim 1 wherein said metallic layer of said substrate comprises a conductive ink.

6. A power module as recited in claim 1 wherein said silicon dice comprise power transistors.

7. A power module as recited in claim 1 wherein said dielectric layer comprises a ceramic.

8. A power module as recited in claim 7 wherein said ceramic is AlN.

9. A power module as recited in claim 1 wherein said metallic base plate comprises copper.

10. A power module as recited in claim 1 wherein said silicon dice comprise power transistors.

11. A power module comprising:

a metallic base plate having a first coefficient of thermal expansion (CTE);

a substrate comprising an dielectric layer sandwiched between a first metallic layer and a second metallic layer, said substrate having a second CTE less than said first CTE;

a solder layer electrically and thermally connecting said second metallic layer to said base plate; and a plurality of silicon dice connected to said first metallic layer; and said solder layer having a solder void development region formed due to said difference in said first and second CTE and thermal cycling of said power module, said dice oriented on said substrate so that said void development region does not extend beneath said dice.

12. A power module as recited in claim 11 further comprising a heat sink, said heat sink thermally coupled to said base.

13. A power module as recited in claim 12 further comprising a thermal grease layer coupling said heat sink to said base plate.

14. A power module as recited in claim 11 wherein said metallic layer of said substrate comprises copper.

15. A power module as recited in claim 11 wherein said metallic layer of said substrate comprises a conductive ink.

16. A power module as recited in claim 11 wherein said dielectric layer comprises a ceramic.

17. A power module as recited in claim 16 wherein said ceramic is AlN.

18. A power module as recited in claim 10 wherein said metallic base plate comprises copper.

* * * * *